United States Patent [19]

Danckaert et al.

[11] Patent Number: 5,043,607

[45] Date of Patent: Aug. 27, 1991

[54] OUTPUT INTERFACE CIRCUIT BETWEEN TWO CIRCUITS OF DIFFERENT NATURES

[75] Inventors: Jean-Yves Danckaert, Les Ulis; Ernesto Perea, Gif Sur Yvette, both of France

[73] Assignees: Thomson Composants Microondes; Thomson-CSF, both of Puteaux, France

[21] Appl. No.: 540,637

[22] Filed: Jun. 19, 1990

[30] Foreign Application Priority Data

Jun. 23, 1989 [FR] France ................ 89 08385

[51] Int. Cl.⁵ .................. H03K 19/12; H03K 17/16
[52] U.S. Cl. ........................... 307/475; 307/448; 307/450
[58] Field of Search ............ 307/443, 448, 450, 475, 307/264

[56] References Cited

U.S. PATENT DOCUMENTS

| | | | |
|---|---|---|---|
| 4,410,815 | 10/1983 | Ransom et al. | 307/475 |
| 4,568,843 | 2/1986 | Gloanec et al. | 307/291 |
| 4,743,957 | 5/1988 | Hirayama | 307/450 |
| 4,800,303 | 1/1989 | Graham et al. | 307/475 |
| 4,810,905 | 3/1989 | Graham et al. | 307/450 |
| 4,926,071 | 5/1990 | MacMillan et al. | 307/475 |

FOREIGN PATENT DOCUMENTS 0085569 8/1983 European Pat. Off. .

OTHER PUBLICATIONS

Patent Abstracts of Japan, vol. 11, No. 20, (E-472) (2467), Jan. 20, 1987, & JP-A-61 192123, Aug. 26, 1986, "ECL Level Output Buffer Circuit", K. Toyama.
Patent Abstracts of Japan, vol. 9, No. 110, (E-314) (1833), May 15, 1985, & JP-A-60 1922, Jan. 8, 1985, Y. Oomori, "Level Converting Circuit".
IEEE Proceedings of the Gallium Arsenide Integrated Circuit Symposium, Nov. 9-11, 1982, pp. 17-20, New York, U.S.A., D. Kinell, "A 320 Gate GaAS Logic Gate Array".

Primary Examiner—Stanley D. Miller
Assistant Examiner—Margaret Rose Wambach
Attorney, Agent, or Firm—Oblon, Spivak, McClelland, Maier & Neustadt

[57] ABSTRACT

This interface constitutes a matching of the output signals of a first circuit, made of GaAs for example, with the limit values of the input signals of a second digital circuit, made of silicon for example. It has a current amplifier which receives the output signal of the GaAs circuit. The voltages at the high level are controlled by a diode in series with a transistor which is then on. At the low level, the transistor is off, and it is two diodes, in parallel with the transistor, that control the output voltage. This interface is integrated into the chip of the digital circuit, made of GaAs. Single figure.

4 Claims, 1 Drawing Sheet

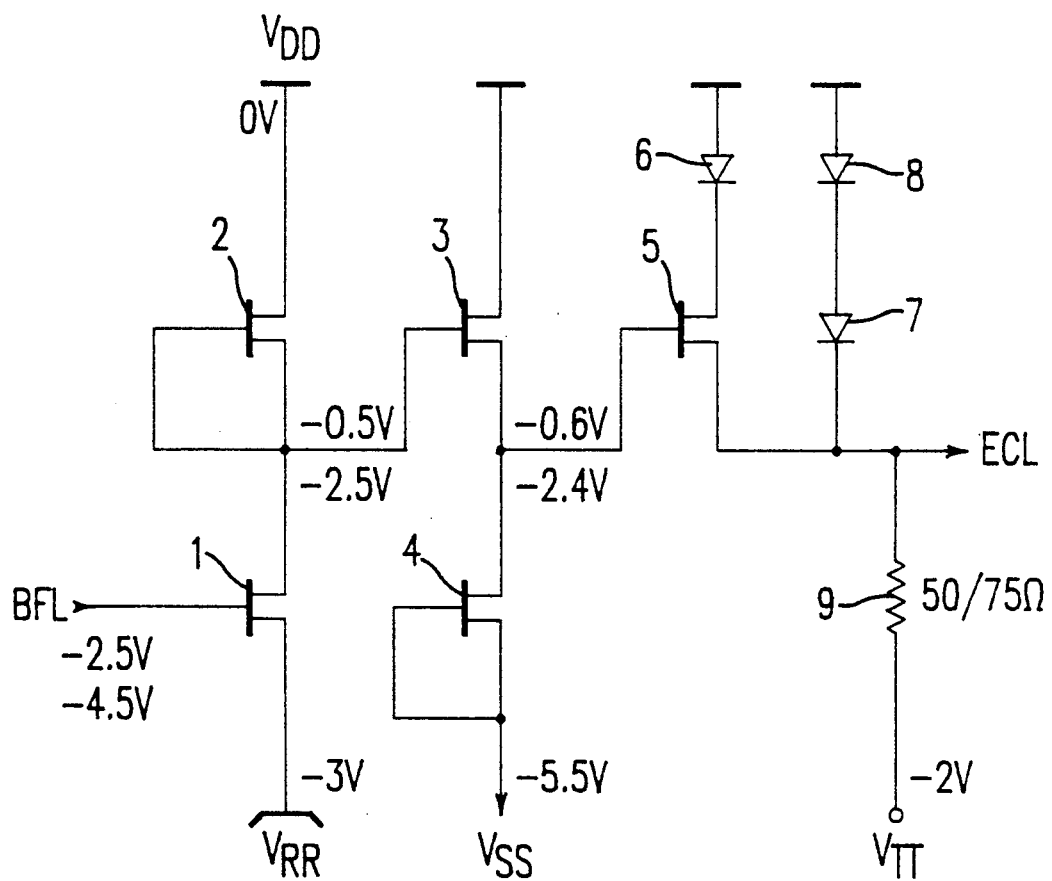

OUTPUT INTERFACE CIRCUIT BETWEEN TWO CIRCUITS OF DIFFERENT NATURES

BACKGROUND OF THE INVENTION

1. Field of the Invention

The present invention concerns an electronic circuit that forms an output interface allowing for the compatibility of BFL type circuits for example, made on GaAs or on group III-V material with ECL type circuits, made on silicon. This interface circuit is itself made of GaAs and is integrated into the chip of the BFL type circuit for which it forms an output contact.

2. Description of the Prior Art

It is known that the processing of microwave signals calls for the use of digital circuits on GaAs (or other fast materials but GaAs is the most commonly used one) and of digital circuits on silicon. Circuits on GaAs are faster and make it possible to reach frequencies that are not attained by circuits on silicon. However, in the present state of the technology, circuits on silicon are more developed and integrated than GaAs circuits. There is therefore a complementarity between these two types of circuits, but the output levels, in terms of voltages, of the silicon circuits are not directly matched with the input levels of the GaAs circuits. This is why an interface is necessary.

To illustrate the invention, let us assume that the GaAs circuit has, at output, a BFL (Buffered FET Logic) gate which is well known, supplied for example between $V_{dd}=0$ V, $V_{ss}=-5.5$ V and with an intermediate voltage $V_{rr}=-3$ V. For a gate such as this, the logic levels at inputs and at output are in the following range: $V_{high}=-2.5$ V approximately and $V_{low}=-4.5$ V approximately, although the output levels can be shifted by means of shift diodes, depending on the chosen supply voltages.

However, the following are the framing values or limit values of ECL type silicon circuits:

| | |
|---|---|
| high output level: | $-1.03 < V_{oh} < -0.88$ |
| low output level: | $-1.83 < V_{ol} < -1.62$ |
| high input level: | $-1.1 < V_{ih}$ |
| low input level: | $V_{il} < -1.5$ |

SUMMARY OF THE INVENTION

The output interface according the invention makes it possible to resolve this problem of differences between the output voltages of the silicon circuits and the voltages required at input of a GaAs circuit.

According to the invention, the output level of the signals coming from the GaAs circuit is controlled by diodes, the current, and consequently the voltage, being fixed by the load resistance external to the circuit. This interface thus includes three stages: a matching and amplification stage, a stage for controlling the high level and a stage for controlling the low level.

More precisely, the invention concerns an output interface circuit, designed to match the output voltages of a first digital circuit on GaAs or group III-V materials with the input limit values of a second digital circuit, of the ECL type, on silicon, said output interface circuit comprising:

a voltage and current amplifier that receives, at the gate of its input transistor, the signal coming from the output of the GaAs circuit;

a stage for the control of the high level of the output voltage, formed by a diode in series with a switch transistor, the gate of which receives the signal coming from the current amplifier, and the source of which is connected to the output of the interface, towards the silicon circuit, a stage for the control of the low level of the output voltage, formed by two diodes in series, mounted in parallel with the stage for the control of the high level, these two stages being supplied between a voltage $V_{dd}=0$ V applied to the diodes and a call-back voltage (i.e. voltage at which the change-over is accelerated) $V_{TT}=-2$ V.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein:

The FIGURE is an electrical schematic of the present invention.

DESCRIPTION OF A PREFERRED EMBODIMENT

The invention will be understood more clearly from the following more detailed description of an exemplary embodiment, the electrical diagram of which is shown in single figure.

The output interface of a circuit made of GaAs towards an ECL type circuit made of silicon has two main functions:

to provide for the compatibility of the levels of voltages, at output of the GaAs chip, with the input limit values of the silicon chip, to enable the use of standardized matched lines, with low impedance: 50 or 75 ohms.

In order that the GaAs integrated circuit, provided with one or more interfaces according to the invention, may be interchangeable with an ECL circuit on silicon, and in order to preserve the noise margins, the same limit values as those of an ECL circuit are placed on the output interface. These are:

| |
|---|
| $-0.85 > V_{oh} > -1$ V |
| $-1.6 > V_{oh} > -1.8$ V |

Since the output levels of a BFL type circuit on GaAs are between $-4.5$ and $-2.5$ V, it is enough to control them to bring them within a range of $-1.8$ and $-0.85$ V. The basis of the invention lies in the control of the output level of the GaAs circuit, not by transistors but by diodes: the output current, hence the voltage, is then fixed by the load resistance external to the GaAs circuit.

The interface circuit according to the invention, shown in a single figure, comprises firstly a current amplifier stage. The output voltage of the GaAs circuit (this circuit is not shown but is symbolized by BFL) is applied to the gate of a transistor 1, supplied by the transistor 2 mounted as a current source: these two transistors are connected to supply voltages $V_{dd}=0$ V and $V_{rr}=-3$ V, for example. If the input voltage varies between $-2.5$ and $-4.5$ V, the output voltage, on the drain of the transistor 1, varies between $-0.5$ and $-2.5$ V. It is applied to the gate of the transistor 3, supplied by the transistor 4 mounted as a current source: these two transistors are connected to supply voltages $V_{dd}=0$ V and $V_{SS}=-5.5$ V, for example. It is clear that the voltages cited may be different, depending on the technology used. The output voltage at the source of the transistor 3 varies between 0.6 V (high level) and $-2.6$ V (low level).

The role of this amplifier is to give a current that is sufficient to charge the stray capacitance of the transistor 5, in the following stage which controls the high level at output.

This stage is formed by a diode 6, the anode of which is at $V_{dd}$, in series with the transistor 5, which has very large dimensions. For example, while the transistors 1 to 4 have widths in the range of 10 to 40 microns, the transistor 5 has a width of the order of 500 microns. This enables it to work in linear mode, and to have a minimum voltage drop: $V_{DS}=50$ mV. It works as an almost perfect switch.

The high level is thus controlled by the diode 6, which itself is also very big (300 microns) and has a voltage drop of the order of 800 mV. Depending on the value of the input voltage, the output voltage, limited solely by the diode 6, is between $-0.9$ and $-1$ V, i.e. it is within the output limit values of an ECL circuit on silicon.

When the output signal of the GaAs circuit is at its low level ($-4.5$ V), the transistor 5 is off. The low level is then controlled by two diodes 7 and 8, supplied from $V_{dd}=0$ V. In going into forward bias, they prevent the output voltage from falling below $-1.8$ V. For, the output load, symbolized by a resistance (reference 9) of 50 or 75 ohms, is connected to a call-back voltage $V_{TT}$ of the order of $-2$ V. Each of the diodes 7 and 8, having standard dimensions of the order of 30 microns, has a voltage drop $V_d=900$ mV, giving 1.8 V for the two diodes.

As specified already, this interface is made directly on the chip of a GaAs integrated circuit, and connected to its outputs: the GaAs circuit then becomes interchangeable with an ECL silicon circuit, since it has the same output limit values, but it works faster.

The output interface according to the invention is specified by the following claims.

What is claimed is:

1. An output interface circuit, designed to match output voltages of a first digital circuit on GaAs or group III-V materials with input limit values of a second digital circuit, of an ECL type, on silicon, said output interface circuit comprising:

a voltage and current amplifier that receives, at a gate of its input transistor, a signal coming from an output of the first digital circuit;

a first stage for controlling a high level of an output voltage of said interface circuit, formed by a diode in series with a switch transistor, said diode connected to a drain of said switch transistor, a gate of said switch transistor receives the signal coming from the voltage and current amplifier, and a source of which is connected to an output of the interface circuit, towards the second digital circuit.

a second stage for controlling a low level of said output voltage of said output interface circuit, formed by two diodes in series, mounted in parallel with said first stage and connected to the output of the interface, said first and second stages being supplied between a voltage $V_{dd}=0$ V applied to the diodes and a call-back voltage of $V_{TT}=-2$ V.

2. An interface circuit according to claim 1, wherein said switch transistor has dimensions sufficient to have a low voltage drop between drain and source, the high level of the output voltage being controlled by a voltage drop in the diode in series with said transistor.

3. An interface circuit according to claim 1 wherein, for an input voltage at a low state, the switch transistor is off, the low level of the output voltage being controlled by a drop in voltage in said two diodes in parallel with said transistor.

4. An interface circuit according to claim 1, 2, or 3, wherein it is integrated into said first digital circuit, and constitutes a matching at output contacts.

* * * * *